(12) United States Patent
Pepper et al.

(10) Patent No.: US 7,701,027 B1
(45) Date of Patent: Apr. 20, 2010

(54) METHOD AND APPARATUS FOR REDUCTION OF NON-ADAPTIVE SIGNALS IN PHOTO-EMF SENSORS

(75) Inventors: David M. Pepper, Malibu, CA (US); Gilmore J. Dunning, Newbury Park, CA (US); Marvin B. Klein, Pacific Palisades, CA (US); Gerald David Bacher, Carlsbad, CA (US); Bruno Pouet, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 121 days.

(21) Appl. No.: 11/367,073

(22) Filed: Mar. 3, 2006

Related U.S. Application Data (60) Provisional application No. 60/658,956, filed on Mar. 4, 2005.

(51) Int. Cl.
   *H01L 29/41* (2006.01)
(52) U.S. Cl. .............. 257/448; 257/E29.112; 257/E31.124
(58) Field of Classification Search ............. 257/448, 257/457, E29.111, E29.112, E29.122, E29.139, 257/E31.124
   See application file for complete search history.

(56) References Cited

U.S. PATENT DOCUMENTS

| 5,457,997 | A   | * | 10/1995 | Naruo et al. .................. 73/643 |
| 5,821,539 | A   | * | 10/1998 | Matz et al. ............. 250/370.01 |
| 6,342,721 | B1  | * | 1/2002 | Nolte et al. ................. 257/448 |
| 6,781,817 | B2  | * | 8/2004 | Andelman .................. 361/503 |
| 2004/0029366 | A1 | * | 2/2004 | Jakoby ....................... 438/496 |

* cited by examiner

*Primary Examiner*—Minh-Loan T Tran
*Assistant Examiner*—W. Wendy Kuo
(74) *Attorney, Agent, or Firm*—Ladas & Parry

(57) ABSTRACT

A method and apparatus for a photoinduced electromotive force sensor. The sensor has an active substrate formed of a semi-insulating photoconductor with sufficient carrier trap density to form an effective charge grating and pairs of electrodes disposed on the active substrate, where the sensor is configured to reduce the photovoltaic effect caused by the incident light in the vicinity of the electrodes. The shape or composition of the electrodes may be selected to reduce the photovoltaic effect or the electrodes may be disposed on the substrate to average out the photovoltaic effect arising from each one of the electrodes.

22 Claims, 9 Drawing Sheets

METHOD AND APPARATUS FOR REDUCTION OF NON-ADAPTIVE SIGNALS IN PHOTO-EMF SENSORS

CROSS REFERENCE TO RELATED PATENTS & APPLICATIONS

The present application claims the benefit of U.S. Provisional Patent Application 60/658,956 filed Mar. 4, 2005, the disclosure of which is hereby incorporated wherein by reference.

The present application may have subject matter similar to that disclosed in U.S. Pat. No. 6,342,721 B1, granted Jan. 29, 2002 to Nolte et al., and United States Patent Application Publication No. 2003/0151102 A1, published Aug. 14, 2002. The contents of U.S. Pat. No. 6,342,721 B1 and United States Patent Application Publication No. 2003/0151102 A1 are incorporated herein by reference in their entireties.

STATEMENT OF GOVERNMENT INTEREST

This invention was made with Government support under Contract No. F33615-95-2-5245 awarded by DARPA. The Government may have certain rights in this invention.

BACKGROUND

1. Field

The present invention relates to non-steady-state photo-induced electromotive force (EMF) sensors and, more specifically, to an apparatus and method for improving the performance of photo-EMF sensors by minimizing or eliminating spurious noise sources.

2. Description of the Related Art

A non-steady-state photo-induced electromotive force (photo-EMF) device can generate time-varying photocurrents in response to a corresponding lateral and rapid shift of an optical pattern across its surface. The optical pattern may have, for example, the form of a moving optical fringe pattern or a moving speckle pattern. Conventional photodetectors, on the other hand, respond only to changes in the incident light level, and not to the lateral motion of an optical pattern. For example, if there are several fringes incident on the surface of a conventional photodetector, there may not be any response to a moving pattern, since as each bright fringe leaves the active region of the conventional photodetector, another bright fringe may enter the active region at the same time from the opposite side of the active region.

Figure 1:
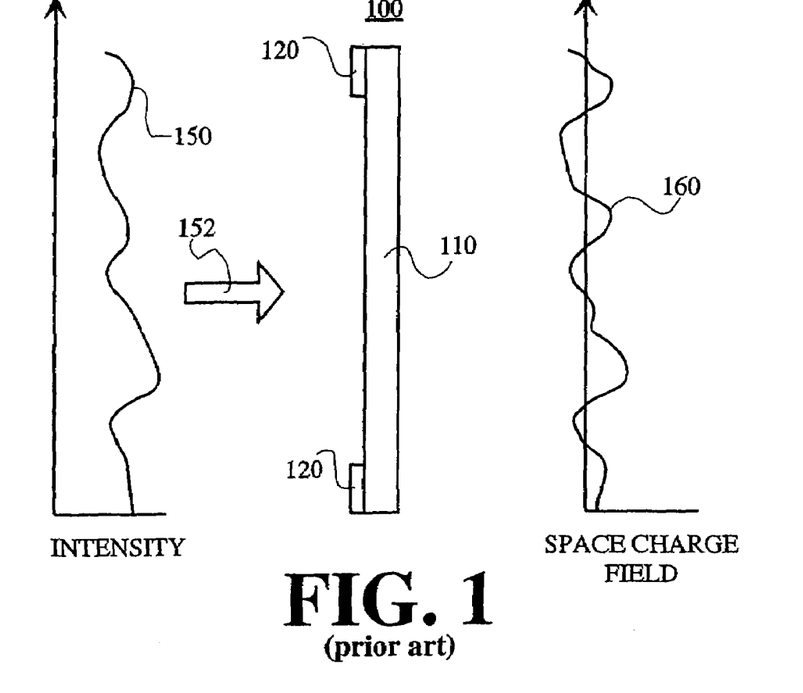
FIG. 1 (prior art) shows a conventional photo-EMF sensor.

A photo-EMF sensor resembles a conventional semiconductor detector; however, to provide the pattern response characteristics described above, it can develop an internal lateral electric field that stores the spatial intensity pattern of an incident optical beam. FIG. 1 shows a conventional photo-EMF sensor 100 comprising a detection substrate 110 and a pair of surface electrodes 120. To provide the photo-EMF function, the detection substrate 110 is typically formed of a semi-insulating photoconductor with sufficient carrier trap density to form an effective space charge grating. FIG. 1 also shows an intensity pattern 150 of an incident laser beam 152 with the resulting lateral internal space charge field 160 developed in the material between the electrodes 120. The detection substrate 110 may comprise gallium arsenide and the surface electrodes 120 may comprise a titanium/gold alloy.

One application of a photo-EMF sensor is in a velocity, or differential, sensing interferometer system, in which the photo-EMF sensor acts as a fringe processing unit. See, for example, the system described by Pepper et al. in U.S. Pat. No. 5,909,279, "Ultrasonic Sensor Using Short Coherence Length Optical Source, and Operating Method," issued Jun. 1, 1999. In such a system, interference fringes are directed onto the surface of a photo-EMF sensor. Photo-generated carriers are then produced which diffuse away from regions of intense optical radiation. These carriers become trapped and formed a periodic charge pattern and the corresponding space-charged field. In the absence of any change in the interference pattern, the space charge field is static and no net current is produced from the photo-EMF detector. However, if the interference pattern changes at a sufficiently high rate, the space charge field can not track the changes, and a net current is produced by the photo-EMF sensor.

Hence, a key feature of a photo-EMF sensor is that it senses rapid motion of an optical pattern across its surface by generating a photo-EMF current in response to the rapidly moving pattern. As noted above, the pattern may be a set of interference fringes resulting from the interference of two light beams, and the rapid motion of the pattern may be the result of one of the beams experiencing a dynamic phase shift. In a laser-ultrasound probing system, the dynamic phase shift may be the result of motion in a probed surface. In a laser communication receiver, the motion may be due to phase-modulation encoded onto a light beam. The photo-EMF sensor is adaptive, since static and slowly varying changes, such as those due to beam wander, vibrations, thermal effects, turbulence, are adaptively tracked. The photo-EMF sensor will produce no current for such changes, as long as the space-charge field formation time is faster than the changes. Thus, the photo-EMF sensor can adaptively compensate for the effects due to these changes. This adaptive compensation capability makes the photo-EMF sensor extremely attractive for multiple applications, since the sensor detects high-bandwidth information, while suppressing low bandwidth noise.

Photo-EMF sensors known in the art may comprise a plurality of interlaced electrode pairs, e.g., interdigitated contacts. See, for example, U.S. Pat. No. 6,342,721, issued Jan. 29, 2002 to Nolte et al. See also Nolte et al., "Enhanced Responsivity of Non-Steady-State Photoinduced Electromotive Force Sensors Using Asymmetric Interdigitated Contacts," Optics Letters, vol. 24, no. 5, March 1999, pp. 342-344. These references disclose the use of multiple contacts with alternating wide and narrow active-area spacings, with the currents from the wide-spaced active area regions summed, while the narrow areas are optically blocked or rendered insensitive. The use of multiple contacts helps improve the response of the photo-EMF sensor, while using narrow-active areas that are optically blocked or rendered insensitive helps decrease the back action current that may arise from proximate electrodes.

However, in photo-EMF sensors known in the art, even those using multiple electrodes, the photo-EMF sensor may not always track out (or, adapt to) all the undesirable noise, owing to photovoltaic (i.e., band bending) effects at or near the electrodes. Those skilled in the art recognize that a band-bending region exists as a small region near a metal contact on semiconducting material, which has an electric field that emerges from the contact and goes into an active area. This band-bending region arises because the Fermi energy of the metal pins at a surface energy different than a Fermi level of the semiconducting material. The electric field may exist over a limited distance from the contact, which may be in the range of several microns from the contact. The band-bending region and the photovoltaic effect are well known to those skilled in the art of conventional semiconductors and photodetectors.

However, in photo-EMF sensors known in the art, the response of the photo-EMF sensor to an optical pattern that travels through the band-bending region is different than the response of the sensor as the optical pattern travels through other portions of the active region or regions of the sensor. That is, as the optical pattern moves through the electric field gradient due to the photovoltaic effect, a measurable current is generated, even at low frequencies of the lateral motion of the pattern. This effect may result in large-voltage output level variations from the presence of dynamic and spatial amplitude changes in the optical intensity near the electrodes, whose time scales can range from DC (a fixed pattern feature near an electrode) to the upper limit of the detection bandwidth. As such, these noise sources are not adaptively compensated. This can result in significant saturation of subsequent high-gain amplifiers, as well as a degradation in the system dynamic range. Simply AC coupling the sensor to the amplifiers will not eliminate this problem, especially in the case of signals whose bandwidths are similar to the photovoltaic induced noise.

SUMMARY

Embodiments of the present invention provide a method and apparatus for reducing the noise effects caused by an interaction of the optical pattern incident on the surface of a photo-EMF sensor and the electrodes used to couple current from the sensor. Embodiments of the present invention may use selected materials and/or selected shapes for the electrodes to reduce the photovoltaic effect arising from the electrodes. Preferably, the Fermi energy of the metal of the electrodes roughly matches up with the Fermi level of the semiconducting material in the vicinity of the electrodes. Embodiments of the present invention may use spatial and/or temporal averaging of the photovoltaic effect arising from each electrode to result in an overall lessening of the photovoltaic effect. The spatial and/or temporal averaging may be accomplished by choosing desired shapes, sizes and/or spacing for electrodes. The spatial and/or temporal averaging may also be accomplished by patterning or rotating the light incident on the sensor.

One embodiment of the present invention comprises a photoinduced electromotive force sensor receiving incident light, where the sensor comprises: an active substrate formed of a semi-insulating photoconductor with sufficient carrier trap density to form an effective charge grating, and at least one pair of electrodes disposed on the active substrate, where the photo-EMF sensor is configured to reduce the photovoltaic effect caused by the incident light in the vicinity of the electrodes.

Another embodiment of the present invention comprises a method of making a photoinduced electromotive force sensor comprising the steps of providing an active substrate; fabricating at least one pair of electrodes on the substrate; and configuring the sensor to reduce the photovoltaic effect caused by incident light in the vicinity of the electrodes.

Still another embodiment of the present invention comprises a photoinduced electromotive force sensor apparatus comprising; an active substrate formed of a semi-insulating photoconductor with sufficient carrier trap density to form an effective charge grating; and means for sensing a time-varying photocurrent in response to a shift of an optical pattern across a surface of the active substrate, where the means for sensing is configured to reduce the photovoltaic effect caused by light incident on the surface of said active substrate.

Still another embodiment of the present invention comprises a photoinduced electromotive force sensor comprising: a substrate formed of a semi-insulating photoconductor with sufficient carrier trap density to form an effective space charge grating; and a plurality of interlaced electrode pairs disposed over the substrate, each electrode pair including two parallel electrodes defining an active area therebetween with an active area width for each electrode pair, one electrode of each pair being disposed between an adjacent pair of electrodes and proximate one electrode of the adjacent pair; wherein the active area width for each electrode pair varies from the active area width for an adjacent electrode pair.

DETAILED DESCRIPTION

The present invention will now be described more fully hereinafter with reference to the accompanying drawings, in which preferred embodiments of the invention are shown. This invention may be embodied in many different forms and should not be construed as limited to the embodiments set forth herein. Further, the dimensions of electrodes and other elements shown in the accompanying drawings may be exaggerated to more clearly show details. The present invention should not be construed as being limited to the dimensional relations shown in the drawings, nor should the individual elements shown in the drawings be construed to be limited to the dimensions shown.

As discussed above, a significant source of noise or nonadaptive signals in a photo-EMF sensor may result from the photovoltaic effects at or near the electrodes used in the sensor. Embodiments of the present invention reduce the photovoltaic effect as described below.

A first approach for reducing the photovoltaic effect according to embodiments of the present invention is to select an appropriate contact material that provides a smaller band-bending (i.e., depletion) region. Some metals or metal alloys are known in the art to provide smaller band-bending regions, but these metals or metal alloys may also reduce the sensitivity of a photo-EMF sensor in which these metals or metal alloys are used in the electrodes. Hence, a tradeoff may be required between the reduction of the nonadaptive component caused by the photovoltaic effect and the overall sensitivity of the sensor. The tradeoff may depend upon the frequencies which are to be detected by the sensor, since the nonadaptive component primarily appears at low frequencies and sensitivity of the sensor generally rolls off at higher frequencies.

Figure 2:
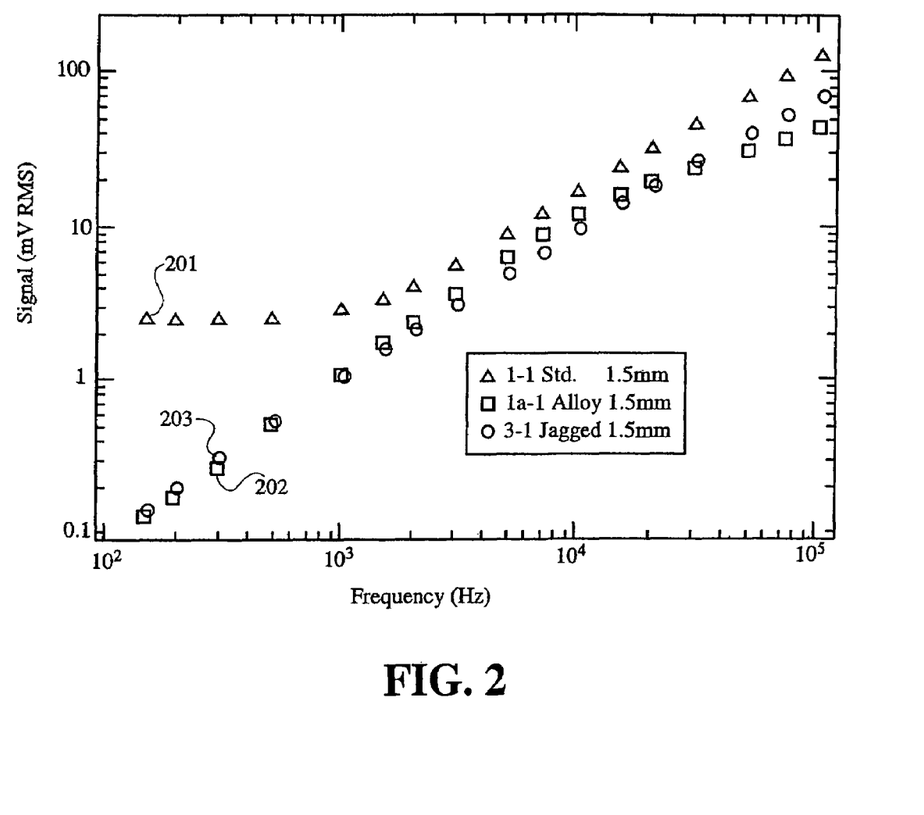
FIG. 2 shows the frequency response provided by various embodiments of the present invention.

Conventional photo-EMF sensors typically use Titanium/Gold (Ti/Au) electrodes, since Ti/Au contacts are typical in the art of ohmic contacts used in the semiconductor industry. However, contacts comprising Ti/Au generally create a relatively large band-bending region that results in a relatively large non-adaptive photo-EMF noise signal. This non-adaptive problem is especially pronounced at low frequencies. See, for example, FIG. 2 which shows the frequency response (see triangles labeled as 201) of a conventional photo-EMF sensor using Ti/Au contacts. Specifically, note that the frequency response 201 is essentially flat at lower frequencies (less than 1000 Hz).

A first embodiment according to the present invention is provided by forming the electrodes of the photo-EMF sensor using a gold-germanium (Au/Ge) eutectic, which is then annealed, or forming the electrodes using platinum (Pt). Au/Ge is known to produce more ohmic behavior and Au/Ge contacts will have a smaller depletion region with less band bending than the Ti/Au contacts used with prior art photo-EMF sensors. Pt demonstrates ohmic behavior similar to that of Au/Ge. Therefore, in the photo-EMF sensor 100 depicted in FIG. 1, the surface electrodes 120 may comprise a Au/Ge eutectic or Pt, rather than a gold/titanium alloy. Note, however, that the formation of the electrodes using a AuGe eutectic or Pt must be compatible with the sensor materials and fabrication. Photo-EMF sensor electrodes formed in this manner have been shown to significantly minimize the nonadaptive component in the sensor output. Returning to FIG. 2, the measured frequency response of a photo-EMF sensor using Au/Ge electrodes is shown by squares designated as element 202. Note that the photo-EMF device having conventional electrodes has an undesirable (nonadaptive) "noise floor" at low frequencies (see triangles labeled 201), whereas the device with Au/Ge electrodes shows a desired linear relationship between frequency and voltage output, essentially free of spurious nonadaptive response. Other embodiments of the present invention may use other materials for contacts to provide a smaller band-bending region.

As indicated above, the use of materials for contacts that provide smaller band-bending regions may also result in decreased sensitivity for the photo-EMF sensor. For example, the use of either Au/Ge or Pt ohmic contacts may result in a photo-EMF sensor that has a sensitivity that is 2 to 5 times less than that of a sensor using Ti/Au contacts. Hence, a photo-EMF sensor using Au/Ge or Pt ohmic contacts may be less desirable than one using Ti/Au contacts, since it may be less sensitive to a given fringe motion amplitude. However, if minimizing the nonadaptive component is desired, a photo-EMF sensor according to the present invention using Au/Ge, Pt, or similar material for the ohmic contacts may be more desirable than one using Ti/Au contacts. Hence, according to some embodiments of the present invention, selection of an appropriate material for the photo-EMF sensor contacts provides for sensors with the desired response in regard to the nonadaptive components.

Figure 3:
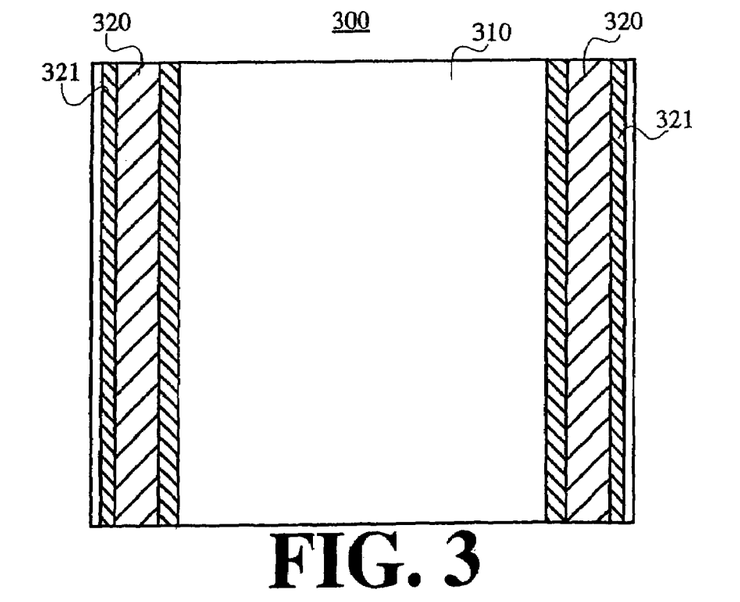
FIG. 3 shows an embodiment of the present invention using selective ion implantation near the electrodes of a photo-EMF sensor.

As discussed above, according to some embodiments of the present invention, one approach to reducing the photovoltaic effect due to the contacts is by selection of appropriate material for the contacts. According to other embodiments of the present invention, another approach is to modify the semiconducting material in a region around the contacts to decrease the band bending around the contacts. For example, another embodiment according to the present invention uses selective ion implantation in a small region, preferably 1-2 microns, near the electrodes in the active area of a photo-EMF sensor. FIG. 3 depicts a photo-EMF sensor 300 comprising a substrate 310 and electrodes 320. As shown in FIG. 3, the photo-EMF sensor 300 further comprises implantation regions 321 located in the vicinity of the electrodes. Localized ion implantation modifies the band bending near the electrodes 320, which minimizes the non-adaptive noise source.

Figure 11:
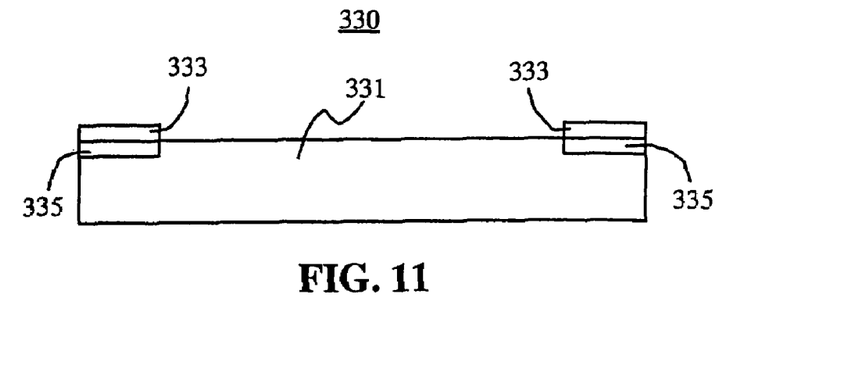
FIG. 11 illustrates an embodiment of the present invention in which proton implantation is used beneath the metal contacts of a photo-EMF sensor.
Figure 11A:
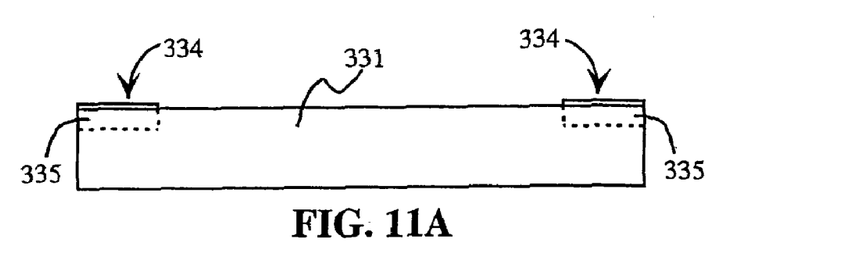
FIGS. 11A-11C show process steps used to fabricate the photo-EMF sensor depicted in FIG. 11.
Figure 11B:
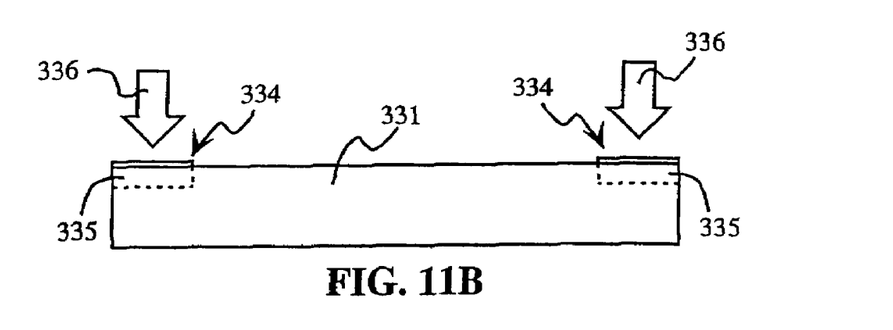
Figure 11C:
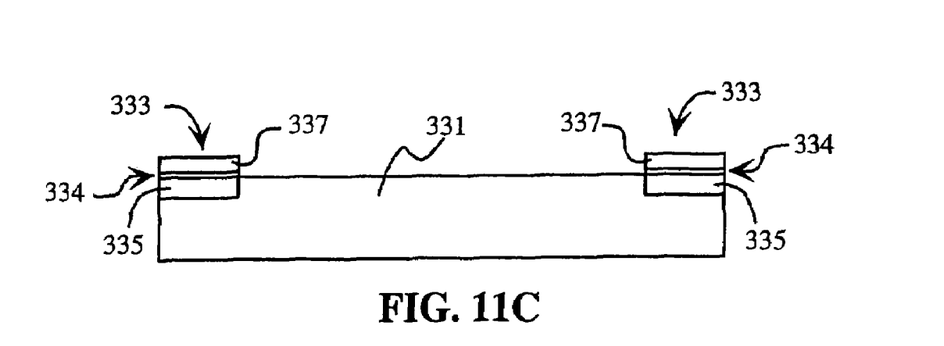

FIG. 11 shows another embodiment of a photo-EMF sensor 330 according to the present invention. In FIG. 11, proton-implanted contact regions 335 in a substrate 331 are disposed beneath metal contacts 333. FIGS. 11A-11C show the steps that may be used to fabricate the sensor 330 depicted in FIG. 11. FIG. 11A shows the deposition of thin layers of gold 334 (a few monolayers) above the contact regions 335. FIG. 11B shows the implantation of the contact regions with protons 336 that pass through the thin layers of gold 334. This helps to pin the Fermi level of the substrate in the contact regions at the Fermi level of the gold. Finally, as shown in FIG. 11C, thick layers of gold 337 are applied on top of the thin layers 334 to form the metal contacts 333. Formation of the metal contacts 333 in this manner should help to reduce band-bending.

Figure 12:
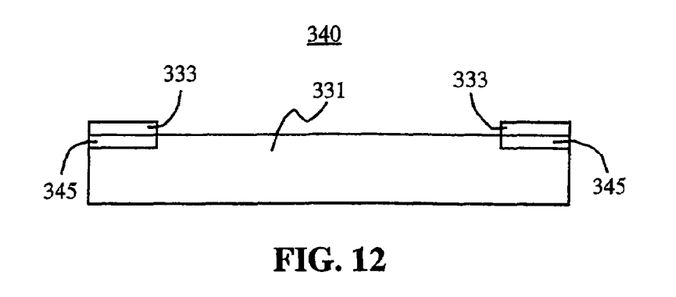
FIG. 12 illustrates an embodiment of the present invention in which an ion-implanted n-type region is disposed beneath the metal contacts of a photo-EMF sensor.

The non-adaptive signals of a photo-EMF sensor may also be reduced by greater contact homogeneity. Greater contact homogeneity should make the non-adaptive signal less susceptible to speckle. FIG. 12 shows an embodiment of a photo-EMF sensor according to the present invention that provides more homogeneous contacts. As shown in FIG. 12, the photo-EMF sensor 340 comprises a substrate 331, contacts 333 and contact regions 345. The contact regions 345 may be formed in a fashion similar to that described above for FIG. 11. Thin layers of the contact material are disposed on the substrate 345 and the contact regions 345 are ion implanted through the thin layers with doping ions. After ion implanting, thick layers of the contact material are applied to the thin layers to form the contacts 333. The contact regions 345 preferably comprise ion-implanted n-type regions (preferably implanted Si in GaAs or implanted P in Si).

Figure 12A:
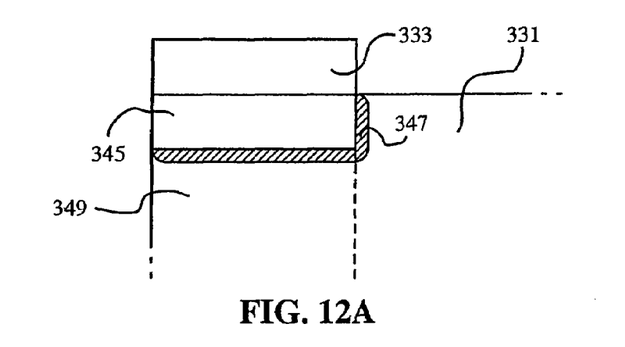
FIG. 12A shows a close-up view of the regions around the ion-implanted n-type region shown in FIG. 12.

The band-bending of the sensor 340 depicted in FIG. 12 may be worse than the other embodiments described above, but the strength of the nonadaptive photovoltaic effect depends on the volume of the depletion (band-bending) region. FIG. 12A shows the depletion region 347 around one of the contacts 333 of the sensor 340 depicted in FIG. 12. FIG. 12A shows that the volumes of the depletion region 347 may be small, even though the amount of band-bending provided in the depletion region may be quite large. As shown in FIG. 12A, the contact 333 also provides a shadow region 349, which shields much of the depletion region 347 from light incident on the sensor 340. Hence, the only contribution to the non-adaptive signal from the sensor 340 would be from light incident on that small portion of the depletion region 347 not under the metal contact 333.

Figure 13:
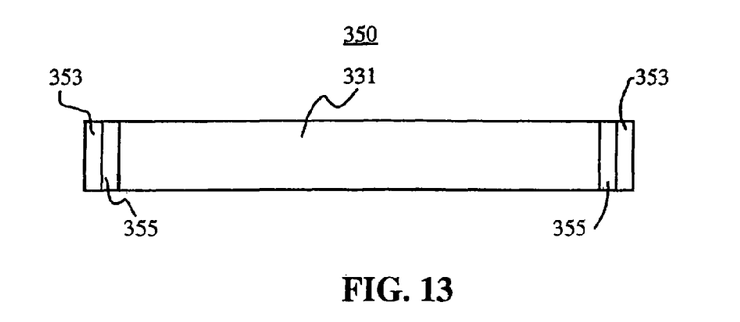
FIG. 13 illustrates an embodiment of the present invention in which the metal contacts of a photo-EMF sensor are disposed in an alternative configuration.

FIGS. 3, 11 and 12 show photo-EMF sensors with the contacts on top of the substrate in a planar arrangement. However, other embodiments according to the present invention may use other contact geometries. For example, FIG. 13 shows an embodiment of a photo-EMF sensor 350 according to the present invention in which contacts 353 are disposed to extend across the depth of the substrate 331. As similarly described above, implanted regions 355 (proton or doped), disposed between the substrate 331 and the metal contacts 353, may be used as described above. Those skilled in the art will understand that contact geometries other than those specifically described and depicted may be used in accordance with the present invention.

Figure 4A:
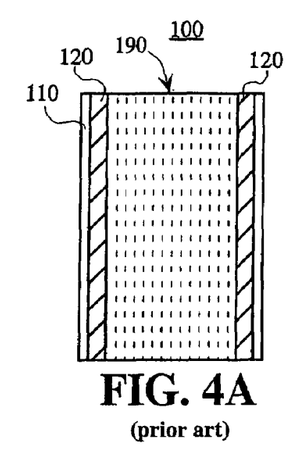
FIG. 4A (prior art) shows a prior art photo-EMF sensor having interference pattern lines parallel to the electrodes of the sensor.

The undesirable non-adaptive noise is maximized under conditions where the electrodes of the photo-EMF sensor "see" the same spatial intensity feature along their lengths. The maximization of the noise effect occurs because the photovoltaic-induced voltage level results from a given intensity at or near the electrodes, which can either be fixed in time, or dynamically varying. Given that the optical pattern incident on a photo-EMF sensor is typically in the form of an interference pattern, lines of uniform intensity (constructive interference) are typically parallel to the surface electrodes. FIG. 4A depicts interference pattern fringes 190 parallel to the surface electrodes 120 on the active substrate 110 of the photo-EMF sensor 100. Given this symmetric situation, the same intensity may be present parallel to and along the entire length of the electrode, thus maximizing the non-adaptive noise effect.

Therefore, if the electrodes and the optical pattern are configured such that the symmetry described above is avoided, the non-adaptive noise effect should be reduced. That is, if the photovoltaic effect can be spatially or temporally "averaged out," the non-adaptive noise effect should be minimized. Discussed below are several approaches according to embodiments of the present invention that may be used alone or combined to achieve the desired minimization of the non-adaptive noise effect.

In some embodiments according to the present invention, it is preferable that the intensity of the light in the vicinity of the electrodes be non-uniform to provide for the desired spatial averaging of the photovoltaic effect. Note that a speckle light pattern provides for non-uniform intensity, since the speckle spots are randomly distributed near the electrodes, resulting in a spatially averaging effect. However, photo-EMF sensors, as described above, are often deployed to detect motion in parallel interference fringe patterns.

Figure 4B:
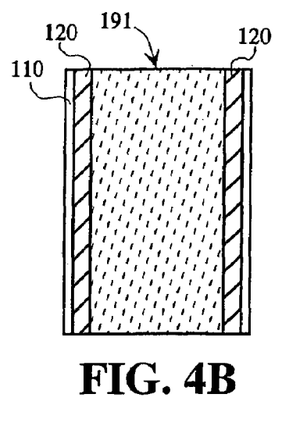
FIG. 4B shows a photo-EMF sensor according to an embodiment of the present invention having interference pattern lines rotated in relation to the electrodes of the sensor.

The interference pattern fringes may be rotated in relation to the parallel electrodes of a photo-EMF sensor to vary the intensity along the surface electrodes. FIG. 4B depicts rotated interference pattern fringes 191 incident on the active substrate 110. Since the interference pattern fringes 191 are not parallel to the surface electrodes 120, the light intensity varies along the surface electrodes 120, resulting in reduced non-adaptive noise. However, rotation of the interference pattern fringes such that they are not parallel to the surface electrodes 120 will reduce the current output of the photo-EMF sensor, and thus result in a decreased signal-to-noise ratio. Further, tilting the interference pattern fringes may result in some periodicity to the noise, since the fringe pattern may be periodic.

Figure 5:
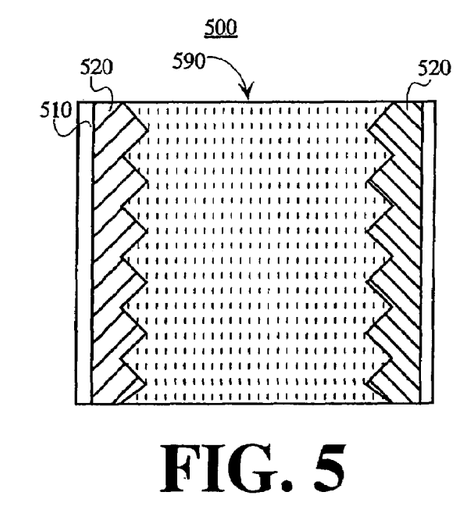
FIG. 5 shows a photo-EMF sensor according to an embodiment of the present invention having jagged electrodes.

Another embodiment of a photo-EMF sensor, according to the present invention, uses serrated or jagged electrodes. By fabricating the electrodes so that they are jagged, different locations along the electrode will experience different intensity levels (in the case of a uniform optical fringe parallel to the electrode). Therefore, the photovoltaic effect will be spatially averaged out by the serrated pattern on the electrode. FIG. 5 shows a photo-EMF sensor 500 comprising an active substrate 510 and a pair of serrated electrodes 520. FIG. 5 also depicts lines of parallel interference fringes 590, showing that the serration of the electrodes 520 provides that different locations of the electrodes will experience different optical intensity levels. Preferably, the electrodes 520 are fabricated such that the amplitudes of the jagged edges are greater than the optical fringe spacing, so that the desired averaging is achieved. Returning to FIG. 2, the results of measurements of a photo-EMF sensor output using electrodes with jagged features are shown by the circle elements 203. Again, a near linear response is shown to occur over the frequencies of interest.

As discussed above, providing non-uniform intensity near the electrodes reduces the non-adaptive noise. In an alternative embodiment of the present invention, the optical fringe pattern itself is intentionally made irregular or jagged (spatially) so as to achieve a similar effect as the serrated electrode pattern discussed above. Since the photovoltaic effect results from a local field gradient, the spatial averaging (i.e., elimination) of this spurious source can be either accomplished by fabricating a jagged pattern on an electrode edge to provide the desired voltage averaging (as above) for an incident parallel optical fringe or by modifying the optical fringe lines of constructive interference as to be jagged, so that illumination of this jagged optical line in the presence of a straight and parallel electrode can realize the same effect of averaging.

Figure 6:
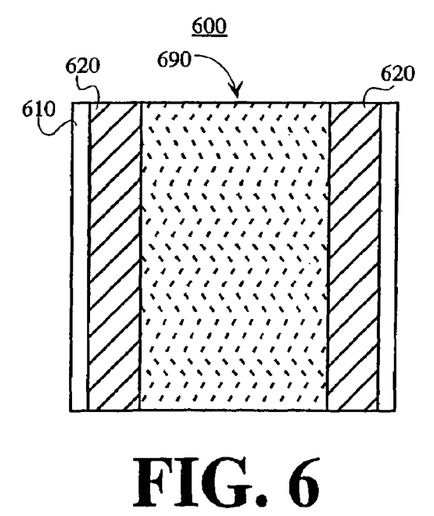
FIG. 6 shows a photo-EMF sensor according to an embodiment of the present invention having irregular interference pattern lines.

FIG. 6 shows an embodiment of a photo-EMF sensor 600 according to the present invention receiving an irregular optical fringe pattern 690. In FIG. 6, a pair of electrodes 620 is disposed on an active substrate 610. As discussed above, the optical fringe pattern 690 is made irregular, so that the intensity of the optical fringe pattern 690 varies across the electrodes 620.

The interference pattern incident on a photo-EMF sensor may be obtained by illuminating the sensor with two laser beams: a reference beam and a probe beam, which has the desired time dependent phase shifting signal to be sensed. The reference beam is typically a plane wave (no phase distortions), while the probe beam is typically distorted. In an interferometer system, the distortion may be due to having been scattered from a rough-cut work-piece. In a communication system, the distortion may be due to propagation through a turbulent atmosphere. Therefore, in the case of minor phase aberrations, the optical interference pattern is basically parallel with some small spatial features.

Figure 9:
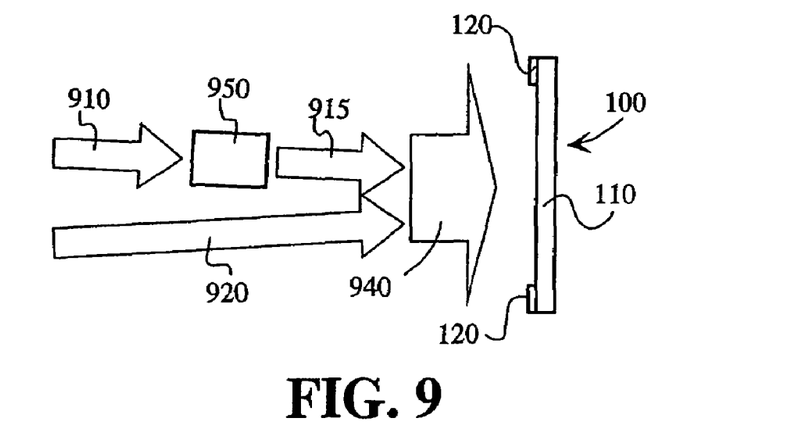
FIG. 9 illustrates an interferometer system in which a distorting apparatus is used to distort light incident on a photo-EMF sensor.

In a system in which the photo-EMF sensor is illuminated by the interference pattern created by two beams, either one beam, the other, or both may be intentionally aberrated so that, at any time, there will be bright as well as dark regions that strike the electrodes of the photo-EMF sensor. In such a case, the electrodes of the photo-EMF sensors may be straight electrodes, because the irregular nature of the interference pattern provides the desired averaging of the nonadaptive component. FIG. 9 illustrates an interferometer system in which a distorting apparatus 950 is used to distort a reference beam 910 to create a distorted reference beam 915. The distorted reference beam 915 typically arrives at a probe beam 920 at an angle from 1 to 10 degrees. The beams 915, 920 then combine to create an interference pattern 940 that illuminates the photo-EMF sensor 100. In alternative embodiments, the distorting apparatus 950 may be placed in the path of the probe beam 920 or both beams 910, 920.

The distorting apparatus 950 may comprise a fixed spatial phase mask. The mask may be in the form of a computer generated glass plate, a predistorted mirror surface, a randomly distorted chemically etched plate, or other such apparatus or methods known in the art. Alternatively, the distorting apparatus 950 may comprise a multi-mode fiber that provides a highly speckled interference pattern. The predistortion of either or both beams should result in an irregular interference pattern at the sensor. Therefore, even in the presence of a set of perfectly straight and parallel electrodes, a spatial averaging of the photovoltaic-induced voltage levels will occur along the length of the electrodes, resulting in the desired elimination of the non-adaptive noise term.

The embodiment of the present invention using predistorted optical fringe patterns may be preferred over the serrated electrode discussed above, since high electric fields may occur at the tips of the jagged structure, which may be undesirable. Also, since the electrode pattern is fixed, changes in the jagged features cannot be easily made, if there are materials variations, etc. Also, the jagged electrode pattern may not be as mechanically stable (e.g., liftoff may occur) as a symmetric, parallel structure.

Figure 14:
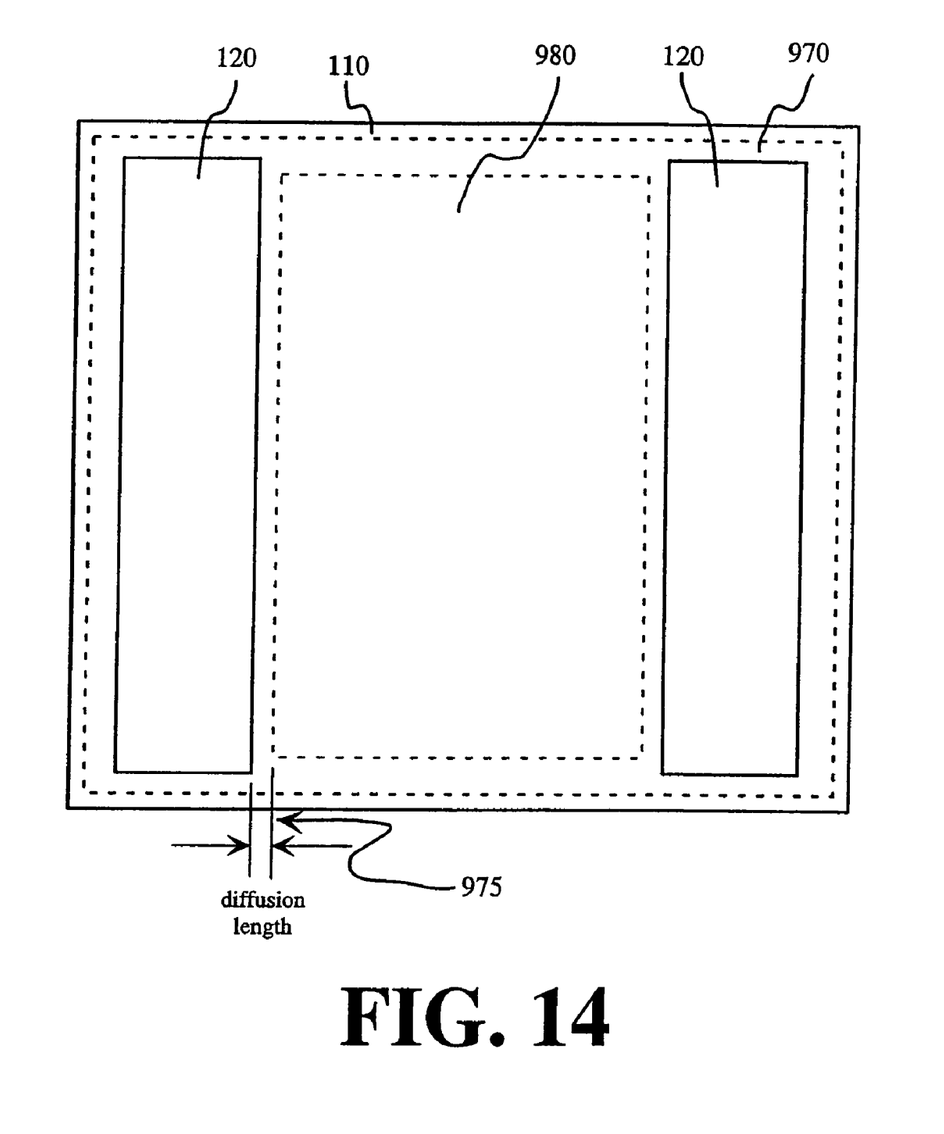
FIG. 14 illustrates an embodiment of the present invention in which a mask is used to direct signal light onto a photo-EMF sensor in regions away from the depletion regions around the contacts.

As discussed above, the non-adaptive signal from a photo-EMF sensor arises due to the presence of interference fringes in the depletion (i.e., band-bending) regions near the contacts. Therefore, the non-adaptive signal may be reduced by eliminating the presence of the interference fringes in the depletion regions. FIG. 14 depicts an embodiment of a photo-EMF sensor according to the present invention, in which a light beam carrying a signal is limited to an area of the photo-EMF sensor away from the depletion regions. As shown in FIG. 14, the sensor comprises a substrate 110 and contacts 120. However, imaging optics (i.e., a mask) are used to limit the exposure of a signal carrying beam to a portion 980 of the substrate that is spaced away from the contacts 120 by the diffusion length 975, i.e., the width of the band-bending regions. A reference beam still illuminates the entire sensor as shown by the reference illumination area 970. The use of a mask for the signal beam to provide that the signal beam only illuminates a portion 980 of the substrate and the provision of a reference illumination area 970 as shown in FIG. 14 provides that there is no shadowing of any portion of the device (resulting in high-resistance regions), while also providing that the interference fringes occur away from the depletion regions. Of course, this approach may also be used with other embodiments of photo-EMF sensors according to the present invention described above and below.

Figure 7A:
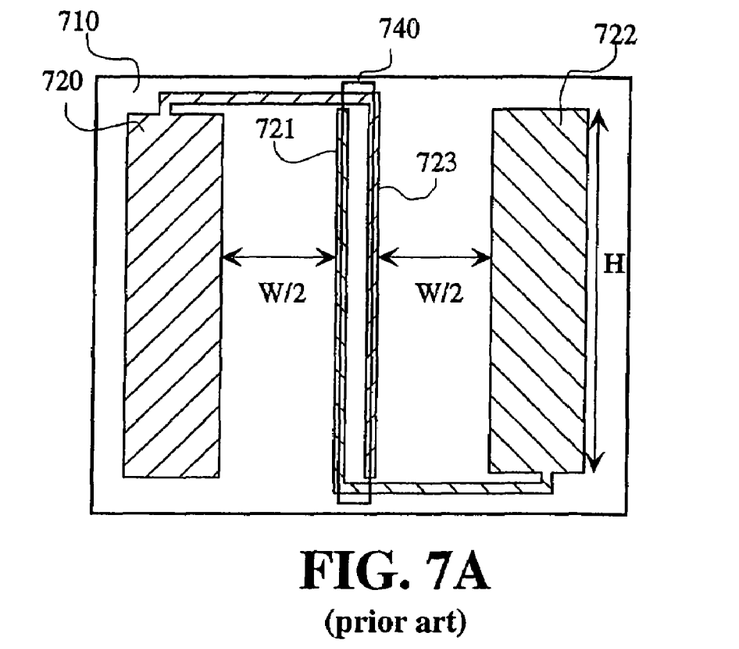
FIG. 7A (prior art) shows a photo-EMF sensor with two pairs of electrodes with equal spacing between the electrodes.
Figure 7B:
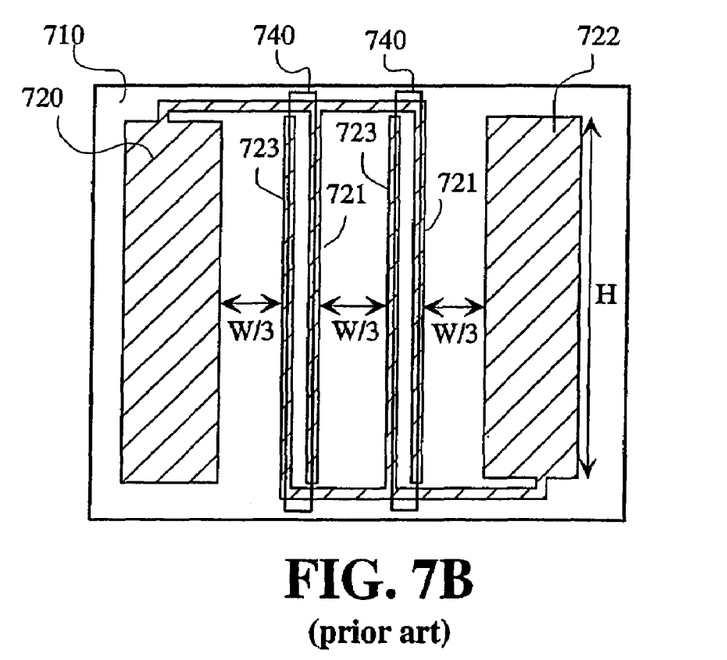
FIG. 7B (prior art) shows a photo-EMF sensor with three pairs of electrodes with equal spacing between the electrodes.

Photo-EMF sensor having asymmetric interdigitated contacts (AIDC's) are known in the art. See, for example, U.S. Pat. No. 6,342,721 discussed above. Photo-EMF sensors with AIDCs have alternating wide and narrow active-area spacings, with the currents from the wide-spaced active area regions summed while the narrow areas are covered by an optically opaque or reflective layer to prevent backaction photo-emf. FIGS. 7A and 7B depict two-pair and three-pair electrode embodiments, respectively, of photo-EMF sensors using the AIDC design. In both FIG. 7A and FIG. 7B, wide surface electrodes 720, 722 are electrically connected to narrow surface electrodes 721, 723 on an active substrate 710. An opaque layer 740 is used to block the illumination between the narrow surface electrodes to prevent backaction photo-EMF. In the two-pair electrode sensor depicted in FIG. 7A, the active region spacing has a width of W/2, where W is the width of the active region of a single pair photo-EMF sensor providing the same amount of photo emf current. In the three-pair sensor depicted in FIG. 7B, the width of the active regions between the electrodes is W/3.

In photo-EMF sensors using the AIDC design, the function of the AIDC electrode pattern is to provide photo-emf current summation at each fringe of a multi-fringe pattern, whose spacing is typically on the order of a carrier diffusion length (about 60 μm for GaAs). Generally, photo-EMF sensors fabricated using multiple electrode pairs will demonstrate an improvement in performance roughly equal to the number of electrode pairs used. For example, a 32 electrode pair photo-EMF sensor has demonstrated a factor of 32 times improvement in the detector responsivity over a single pair sensor. However, such AIDC photo-EMF sensors have also demonstrated the same "non adaptive" noise source as has been shown in single electrode pair devices. The spurious signal (noise source) tends to be prominent when the optical fringe pattern matches the spatial period (or a spatial harmonic thereof). Thus, when a Moire-like interference pattern begins to appear, the spurious signal becomes dominant.

Reduction of the non-adaptive noise in photo-EMF sensors using the AIDC design may be obtained by using the techniques described above. That is, the AIDC electrodes may be fabricated from materials selected to reduce the photovoltaic effect and/or the material around the electrodes may be treated to reduce the photovoltaic effect. The AIDC electrodes may also be serrated and/or the optical fringe pattern may be serrated. However, finely spaced electrode patterns may be difficult to serrate sufficiently (physically or optically) for the desired averaging effect to take place.

Figure 8:
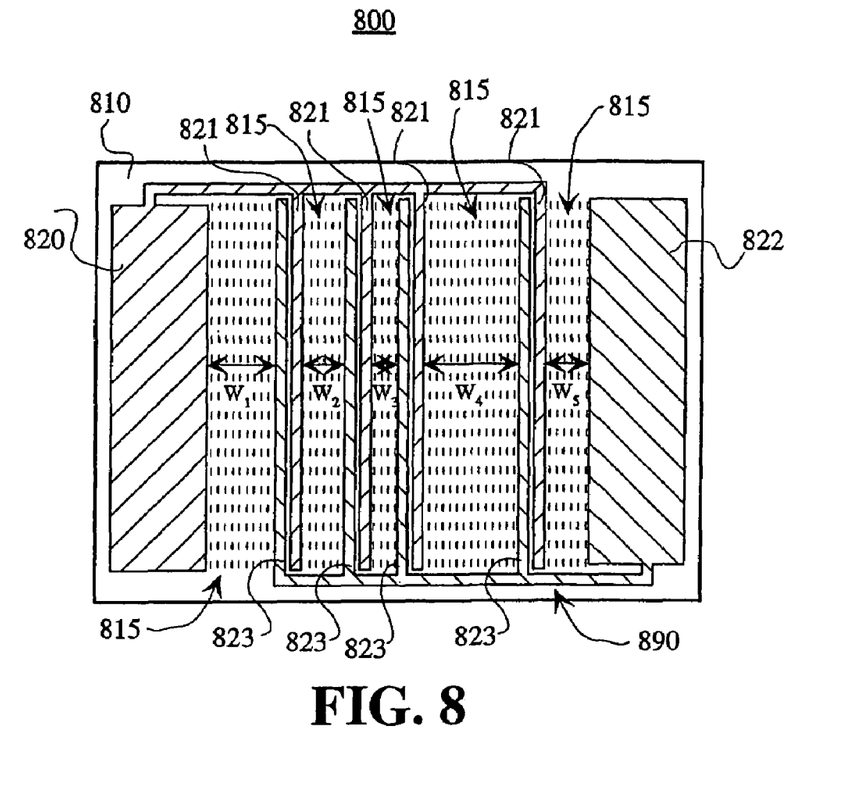
FIG. 8 shows a photo-EMF sensor according to an embodiment of the present invention with staggered spacing between the electrodes.

In another embodiment of the present invention, the electrode spacings on the active substrate in a photo-EMF sensor having AIDC electrodes are staggered. That is, even though all the electrodes are straight and parallel, the interdigitated electrodes are formed so that the spacing of the active regions is not the same for all electrode pairs. This may be achieved, for example, by varying the widths of the active regions between the electrodes, by varying the gaps of the backaction regions, or by varying the width of the electrodes themselves. The staggering of the active regions can either be simply random (over a given range of widths), chirped, made Gaussian, or using a well-defined sequence (a Fibbinochi set, as an example). FIG. 8 shows a photo-EMF sensor 800, with an incident interference fringe pattern 890, comprising a pair of wide surface electrodes 820, 822, a plurality of narrow surface electrodes 821, 823 and an active substrate 810 with active regions 815 having random widths, $w_1, w_2, w_3, w_4, w_5$.

Figure 10A:
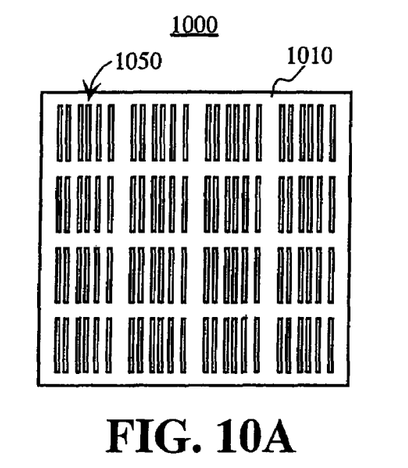
FIGS. 10A-10D illustrate various embodiments of the present invention in which sets of electrodes are laid out in an array to provide a photo-EMF sensor.
Figure 10B:
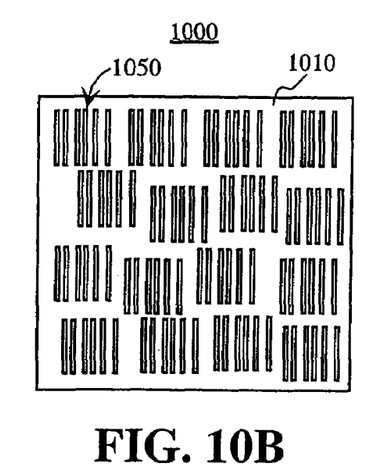

Alternative embodiments of the present invention comprise an array of short-length, yet parallel AIDC electrodes are that arranged in sets of rows and columns, so that a reasonable electrode aspect ratio (length to width) can be maintained, as well as for graceful degradation, in the case of an electrically open or shorted AIDC column. FIGS. 10A-10D illustrate various embodiments of a sensor 1000 comprising sets of AIDC electrodes 1050 arranged in a two-dimensional array. FIG. 10A illustrates a sensor 1000 with sets of AIDC electrodes 1050, which may be spaced internally in a varying pattern as described above, that are laid out in a regular pattern. FIG. 10B illustrates a sensor 1000 where each AIDC electrode set 1050 may be spatially staggered with respect to adjacent AIDC electrode sets 1050. This combined set of staggered electrodes (rows and columns) will tend to provide additional spatial averaging across the entire area of the sensor. Of course, the electrode sets 1050 may also only be staggered in a row-wise sense or a column-wise sense.

Figure 10C:
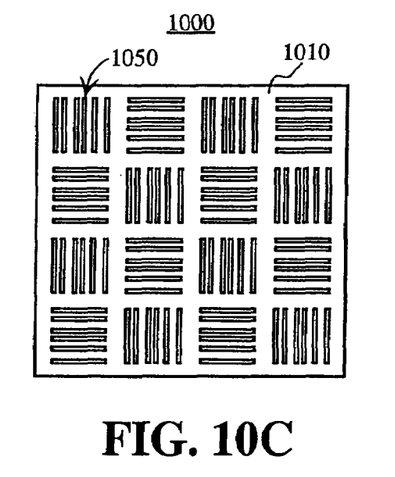
Figure 10D:
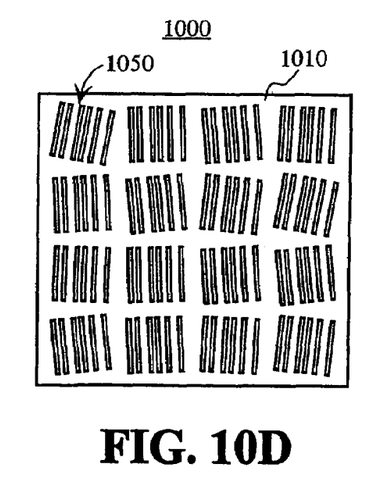

Alternative embodiments of the present invention may also comprise sets of short length but parallel AIDC electrodes where the orientation of the electrodes in each set are rotated with respect to the electrodes in another set. FIG. 10C illustrates a sensor 1000 with sets of AIDC electrodes 1050, which may be spaced internally in a varying pattern, that are laid out in a regular pattern, but the adjacent sets are rotated 90 degrees with respect to each other. Finally, FIG. 10D illustrates a sensor 1000 with sets of AIDC electrodes 1050 that are tilted differently with respect to each other (over small angles, for example, ~10°), either within a AIDC column and/or across the AIDC rows, to achieve yet additional spatial averaging of the photovoltaic-induced voltage level. In sensors using the arrays as discussed above, a small loss of the desired signal may result due to geometrical projection effects of the desired fringe motion relative to the AIDC grating vector direction.

In a preferred embodiment of the present invention, randomly spaced AIDC electrodes may be used in a photo-EMF sensor, where the electrodes comprise Ti/Au material. In such a sensor, the aperiodic electrode spacing would tend to spatially average out the nonadaptive component, while the use of Ti/Au for the electrodes would provide increased sensitivity for the sensor.

From the foregoing description, it will be apparent that the present invention has a number of advantages, some of which have been described herein, and others of which are inherent in the embodiments of the invention described herein. Also, it will be understood that modifications can be made to the apparatus and method described above without departing from the teachings of subject matter described herein. As such, the invention is not to be limited to the described embodiments except as required by the appended claims.

What is claimed is:

1. A photoinduced electromotive force sensor for receiving incident light, said sensor comprising:
   an active substrate formed of a semi-insulating photo conductor with sufficient carrier trap density to form an effective charge grating responsive to the incident light;
   at least one pair of electrodes disposed over said active substrate, at least one of said electrodes having an ion implanted region under said at least one electrode; and
   wherein said sensor is thereby configured to reduce the photovoltaic effect caused by the incident light in the vicinity of the at least one of said electrodes.

2. The sensor according to claim 1, wherein said at least one pair of electrodes is fabricated from contact material producing a smaller band-bending region in said active substrate than a band-bending region resulting when said at least one pair of electrodes is fabricated from titanium-gold.

3. The sensor according to claim 1, wherein said sensor further comprises an ion implanted region around or adjacent said at least one electrode of said at least one pair of electrodes.

4. The sensor according to claim 3, wherein the at least one electrode comprises contact material with a thin layer of the contact material being disposed on the ion-implanted region; the ion-implanted region being enriched with protons or doping ions; and a thick layer of the contact material disposed on the thin layer of contact material.

5. The sensor according to claim 1, wherein said incident light has parallel optical fringes and said at least one pair of electrodes is disposed in a non-parallel and non perpendicular relationship to said parallel optical fringes.

6. The sensor according to claim 1, wherein at least one electrode in said at least one pair of electrodes has a jagged or serrated contour.

7. The sensor according to claim 6, wherein said incident light has optical fringes and said at least one electrode has a maximum width and a minimum width and a space on the active substrate between the maximum width and the minimum width is greater than a space between the optical fringes.

8. The sensor according to claim 1, wherein the sensor further comprises a distorting apparatus disposed between the incident light and said active substrate, the distorting apparatus comprising at least one apparatus selected from the group consisting of a computer generated glass plate, a predistorted mirror surface, a randomly distorted chemically etched plate, jagged edges on at least one electrode of said at least one pair of electrodes, means for rotation of interference fringe patters relative to at least one pair of electrodes so that the interference fringe patters are neither parallel nor perpendicular to a major axis of each of said electrodes of said at least one pair of electrodes or a multi-mode optical fiber.

9. The sensor according to claim 1 wherein the electrodes of the at least one pair of electrodes have one or more depletion regions in the active substrate disposed adjacent the electrodes and the sensor further comprises:
   reference beam imaging optics adapted to direct a reference beam onto a sensor; and
   signal beam imaging optics adapted to direct a signal beam onto the sensor, wherein the signal beam illuminates those only portions of the active substrate that do not include the depletion regions.

10. The sensor according to claim 1, wherein said at least one pair of electrodes comprises:
    a plurality of interlaced electrode pairs, each electrode pair of said plurality of interlaced electrode pairs including two parallel electrodes, wherein one electrode of each pair being disposed between an adjacent pair of electrodes and proximate one electrode of the adjacent pair;
    a plurality of active portions on said active substrate, each active portion having an active portion width defined by a distance between each electrode of each electrode pair of said plurality of interlaced electrode pairs, the active portion widths being non-constant widths; and
    a plurality of backaction portions on said active substrate, each backaction portion having a backaction portion width defined by a distance between an electrode of an electrode pair and the proximate electrode of the adjacent electrode pair.

11. The sensor according to claim 10, wherein said active portion widths and/or said backaction portion widths vary in a random sequence, in a chirped sequence, in a Gaussian sequence, Fibonacci set sequence or in another defined sequence.

12. The sensor according to claim 11, wherein said plurality of interlaced electrode pairs comprises a plurality of sets of electrode pairs and wherein said active portion widths and/or said backaction portion widths within each set of electrode pairs vary, and said sets of electrode pairs are disposed on said active substrate in a two dimensional array of rows and columns.

13. The sensor according to claim 12, wherein each set of electrode pairs is spatially staggered with respect to adjacent sets of electrode pairs.

14. The sensor according to claim 12, wherein at least one set of electrode
pairs is tilted with respect to an adjacent set of electrode pairs.

15. The sensor according to claim 1, wherein said at least one pair of electrodes comprises:
a plurality of interlaced electrode pairs disposed over the substrate, each electrode pair including two parallel electrodes defining an active area therebetween with an active area width for each electrode pair, one electrode of each pair being disposed between an adjacent pair of electrodes and proximate one electrode of the adjacent pair; wherein the active area width for each electrode pair varies from the active area width for an adjacent electrode pair.

16. The sensor according to claim 15 wherein the electrodes of at least one interlaced pair of electrodes have one or more depletion regions in the substrate disposed adjacent the electrodes and the sensor further comprises:
reference beam imaging optics adapted to direct a reference beam onto the sensor; and
signal beam imaging optics adapted to direct a signal beam onto the sensor, wherein the signal beam illuminates those portions of the substrate that do not include the depletion regions.

17. The sensor according to claim 16, wherein the sensor further comprises a plurality of backaction regions, each backaction region having a width defined by a distance between one electrode of one interlaced electrode pair of said plurality of interlaced electrode pairs and a proximate electrode of an adjacent interlaced electrode pair.

18. The sensor according to claim 10, wherein an active portion width of one active portion in the plurality of active portions does not equal an active portion width of another active portion in the plurality of active portions.

19. The sensor according to claim 12, wherein at least one of the columns in the two dimensional array comprises a center line that is substantially parallel to the at least one of the columns and wherein a center point of at least one set of electrode pairs in the at least one of the columns is not disposed on the center line of the at least one of the columns.

20. The sensor according to claim 12, wherein at least one of the rows in the two dimensional array comprises a center line that is substantially parallel to the at least one of the rows and wherein a center point of at least one set of electrode pairs in the at least one of the rows is not disposed on the center line of the at least one of the rows.

21. The sensor according to claim 14, wherein the at least one set of electrode pairs is tilted with respect to the adjacent set of electrode pairs by less than 90°.

22. The sensor according to claim 1, wherein at least one pair of electrodes is comprised of platinum disposed over said active substrate.

* * * * *